United States Patent
Sato et al.

(10) Patent No.: US 6,501,143 B2
(45) Date of Patent: Dec. 31, 2002

(54) SPIN-VALVE TRANSISTOR

(75) Inventors: Rie Sato, Yokohama (JP); Koichi Mizushima, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/893,447

(22) Filed: Jun. 29, 2001

(65) Prior Publication Data

US 2002/0000575 A1 Jan. 3, 2002

(30) Foreign Application Priority Data

Jun. 30, 2000 (JP) ........................................ 2000-200133

(51) Int. Cl.[7] .............................................. H01L 29/82
(52) U.S. Cl. ........................ 257/421; 257/425; 257/427; 257/536
(58) Field of Search ................................ 257/421, 425, 257/427, 536

(56) References Cited

U.S. PATENT DOCUMENTS 5,747,859 A    5/1998   Mizushima et al. ......... 257/421
6,218,718 B1 * 4/2001   Gregg et al. ................. 257/421
6,359,829 B1 * 3/2002   Van Den Berg ............ 365/232

FOREIGN PATENT DOCUMENTS

JP    2000-150237  * 5/2000
JP    2001-94172     4/2001

OTHER PUBLICATIONS

Lenczowski et al., Giant Magnetoresistance of Electrode-posited Co / Cu Multilayers, 148 J. of Magnetism and Magnetic Materials 455–65 (1995).*

D.J. Monsma, et al., "Perpendicular Hot Electron Spin–Valve Effect in a New Magnetic Field Sensor: The Spin–Valve Transistor", The American Physical Society, Physical Review Letters, vol. 74, No. 26, Jun. 26, 1995, pp. 5260–5263.

K. Mizushima, et al., "Energy–Dependent Hot Electron Transport Across a Spin–Valve", IEEE Transactions on Magnetics, vol. 33, No. 5, Sep. 1997, pp. 3500–3504.

* cited by examiner

Primary Examiner—Carl Whitehead, Jr.
Assistant Examiner—Jeff Vockrodt
(74) Attorney, Agent, or Firm—Oblon, Spivak, McClelland, Maier & Neustadt, P.C.

(57) ABSTRACT

A spin-valve transistor has an emitter, a base including a spin-valve film in which two magnetic layers are stacked with interposing a nonmagnetic layer between the two magnetic layers, and a collector, the spin-valve film having a stacked structure of M/A/M' or M/B/M' and the spin-valve film being (100)-oriented, where each of M and M' includes at least one element selected from the group consisting of Fe, Co, Ni and an alloy including Fe, Co, Ni, A includes at least one element selected from the group consisting of Au, Ag, Pt, Cu and Al, and B includes at least one element selected from the group consisting of Cr and Mn.

8 Claims, 5 Drawing Sheets

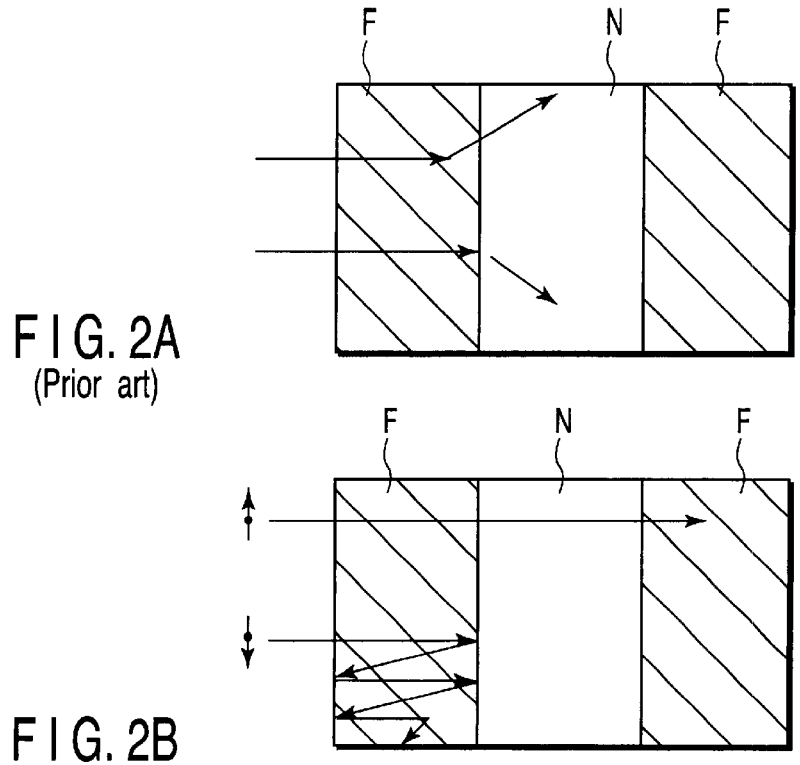
FIG. 2A (Prior art)
FIG. 2B
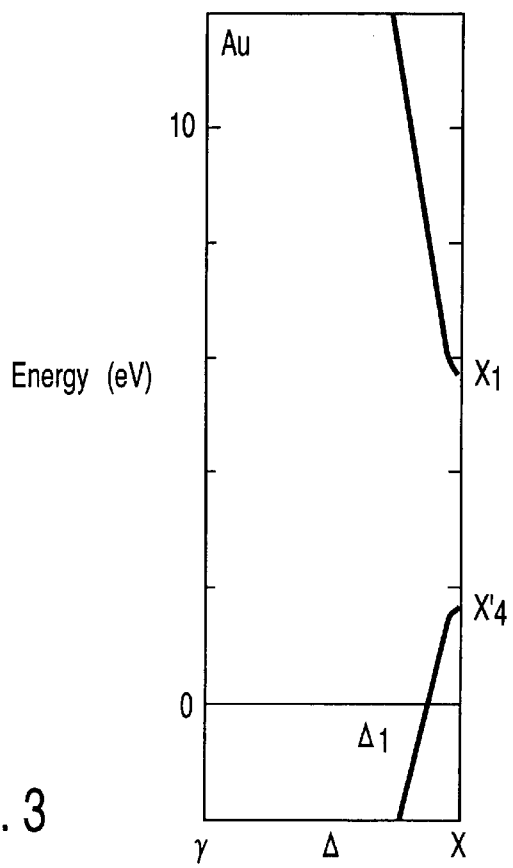
FIG. 3

SPIN-VALVE TRANSISTOR

CROSS-REFERENCE TO RELATED APPLICATIONS

This application is based upon and claims the benefit of priority from the prior Japanese Patent Application No. 2000-200133, filed Jun. 30, 2000, the entire contents of which are incorporated herein by reference.

BACKGROUND OF THE INVENTION

1. Field of the Invention

The present invention relates to a spin-valve transistor, which can be suitably employed, for example, in a magnetic head for reading high-density magnetic recording and in a high-density memory device such as a magnetic RAM (MRAM) and a magnetic ROM (MROM).

2. Description of the Related Art

Highly increased density and velocity of magnetic recording in recent years can be mainly attributed to progress in magnetic recording apparatuses, in particular, to progress in magnetic heads used for writing and reading of magnetic recording as well as to improvement in magnetic recording media. As the magnetic recording medium is increasingly reduced in size and improved in capacity, a relative velocity between the magnetic recording medium and the magnetic reading head is decreased correspondingly. In order to provide a high output even under such a situation, a giant magnetoresistive head (GMR head) comprising a spin-valve film has been developed as a new-type readout magnetic head. The GMR head has excellent characteristics in that it provides a high magnetoresistance ratio (MR ratio) compared with a conventional MR head. Recently, a GMR head of a tunnel junction type that is expected to exhibit even better characteristics is attracting a lot of attention.

Conventional magnetic recording media such as a magnetic disc is designed to function as a file memory, in which information stored therein is once read into a semiconductor memory (DRAM or SRAM) of a computer before the information is utilized. Certainly, the semiconductor memory has various excellent characteristics, but is accompanied with a defect in that it consumes high electric power for memory holding. In recent years, a flash memory and an FRAM, which require no electric power for memory holding, have been developed, but they have a drawback in that the number of rewrite operations is rather limited. On the other hand, endeavor to develop a magnetic memory (MRAM), which permits substantially infinite rewrite operations, has been started. In order to realize the MRAM, however, development of a material or a device capable of exhibiting a high MR ratio is desired.

Under the circumstances, a magnetic tunnel junction element is now attracting a lot of attention as an element exhibits a higher MR ratio than the conventional spin-valve film. The magnetic tunnel junction element or a combination of the magnetic tunnel junction element and a MOS transistor has been used in attempts to fabricate a magnetic head or a magnetic memory. Further, development of a spin-valve transistor capable of exhibiting a higher MR ratio than the magnetic tunnel junction element has also been started.

FIGS. 1A and 1B show examples of band diagrams of conventional spin-valve transistors.

The spin-valve transistor shown in FIG. 1A is of a type in which electrons are injected from an emitter via a tunnel junction into a base. This spin-valve transistor has a stacked structure of an Al emitter 11, a tunnel insulator 12, a base 13 comprising an Fe/Au/Fe spin-valve film, and an n-Si collector 14.

On the other hand, the spin-valve transistor shown in FIG. 1B is of a type in which electrons are injected from an emitter via a Schottky junction into a base. This spin-valve transistor has a stacked structure of an n-Si collector 21, a base 22 comprising a Co/Cu/Co spin-valve film, and an n-Si collector 23.

These spin-valve transistors are known to exhibit an extremely high MR ratio of several hundreds percent. However, these conventional spin-valve transistors have a defect in that a collector current (Ic) is extremely low, for example, in the level of about $10^{-4}$ of an emitter current (Ie). This low ratio of collector current/emitter current (Ic/Ie) is undesirable in view of power consumption, operating speed, noise, and so on.

The reason why the collector current is extremely low in the conventional spin-valve transistors can be explained as follows. For example, in the case of the spin-valve transistor shown in FIG. 1A in which electrons are injected from the emitter via the tunnel junction into the base, angle dependency of the tunnel current can be represented by the following equation:

$$J_\theta \; \exp[-\beta^2 \sin^2\theta] \qquad (1)$$

where $\beta^4 = 2\,ms^2 E_F^2/h^2(E_v - E)$; $\theta$ is an angle formed between the normal line to the junction surface and a wavenumber vector of electrons; $J_\theta$ is a current density in the direction of $\theta$; m is the mass of electron; s is a width of the tunnel barrier; $E_F$ is Fermi energy; h is the Planck constant; $E_v$ is a height of the tunnel barrier; and E is energy of tunnel electrons.

It will be seen from this equation that, when the direction of travel of electrons passing through the tunnel insulator is almost perpendicular to the junction surface, the tunnel current can be increased. Even in the case of the spin-valve transistor shown in FIG. 1B in which electrons are injected from the emitter via the Schottky junction into the base, the current can be increased when the direction of travel of electrons is almost perpendicular to the junction surface.

The spin-valve transistor is designed to operate based on spin-dependent scattering of electrons, which means that the manner of electron scattering changes depending on whether the spin directions are parallel or antiparallel in the two magnetic films of the spin-valve film included in the base. However, in the conventional spin-valve transistor, diffusive scattering is mainly caused within the magnetic layer (F) or at the interface between the magnetic layer (F) and the nonmagnetic layer (N) as shown in FIG. 2A. In this case, since the scattered electrons are incapable of flowing into the collector due to a strong diffraction effect at the interface between the base and the collector, the collector current is decreased. Therefore, in order to increase the collector current, it is necessary to reduce the diffusive scattering. However, there arises a problem that the MR ratio is also reduced if the diffusive scattering is reduced.

BRIEF SUMMARY OF THE INVENTION

An object of the present invention is to provide a spin-valve transistor capable of exhibiting a high MR ratio and a high ratio of collector current/emitter current.

According to an aspect of the present invention, there is provided a spin-valve transistor comprising: an emitter, a base comprising a spin-valve film in which two magnetic layers are stacked with interposing a nonmagnetic layer between the two magnetic layers, and a collector, the spin-valve film having a stacked structure of M/A/M' or M/B/M' and the spin-valve film being (100)-oriented, where M and M' may be the same or different and individually comprises at least one element selected from the group consisting of Fe, Co, Ni and an alloy including Fe, Co, Ni; A comprises at least one element selected from the group consisting of Au, Ag, Pt, Cu and Al; and B comprises at least one element selected from the group consisting of Cr and Mn.

According to another aspect of the present invention, there is provided a spin-valve transistor, comprising: a spin-valve film comprising a first magnetic layer and a second magnetic layer stacked with interposing a nonmagnetic layer between the first and the second magnetic layers, the spin-valve film being (100)-oriented; a first electrode electrically connected to the first magnetic layer; a second electrode electrically connected to the second magnetic layer; wherein each of the first and the second magnetic layers comprises at least one element selected from the group consisting of Fe, Co, Ni and an alloy including Fe, Co, Ni; the nonmagnetic layer comprises at least one element selected from the group consisting of Au, Ag, Pt, Cu, Al, Cr and Mn.

According to still another aspect of the present invention, there is provided a spin-valve transistor manufactured by a process comprising: forming a first electrode on a substrate being (100)-oriented by epitaxial growth; forming a first magnetic layer on the first electrode; forming a nonmagnetic layer on the first magnetic layer; forming a second magnetic layer on the nonmagnetic layer; forming a second electrode on the second magnetic layer, wherein the first magnetic layer, the nonmagnetic layer and the second magnetic layer are formed with a deposition rate within the range of 0.01 nanometers per second to 0.1 nanometers per seconds.

BRIEF DESCRIPTION OF THE SEVERAL VIEWS OF THE DRAWING

FIG. 2A is a diagram illustrating diffusive scattering of electrons at the interface between the magnetic and non-magnetic layers of a conventional spin-valve transistor;

FIG. 2B is a diagram illustrating ballistic conduction and interface reflection of electrons at the interface between the magnetic and nonmagnetic layers of a spin-valve transistor according to an embodiment of the present invention;

FIG. 3 is a graph illustrating the energy band of Au in the [100]-direction;

DETAILED DESCRIPTION OF THE INVENTION

The present inventors have found that, when a (100)-oriented spin-valve film having a stacked structure of a magnetic layer/a nonmagnetic layer/a magnetic layer is employed as a base of the spin-valve transistor, it is possible to increase a ratio of collector current/emitter current (Ic/Ie) with retaining a high MR ratio. When the base including the (100)-oriented spin-valve film is used, the diffusive scattering as shown in FIG. 2A can be suppressed, and instead, ballistic conduction or interface reflection of electrons is caused at the interface of magnetic layer (F)/nonmagnetic layer (N), depending on whether the spins of the two magnetic layers are parallel or antiparallel as shown in FIG. 2B. Namely, if a magnetic layer sufficiently thin as compared with an electron mean free path in the magnetic layer is used and a flat interface between magnetic/nonmagnetic layers is formed so as to generate the ballistic conduction or interface reflection of electrons, it becomes possible to provide a transistor that exhibits a high ratio of Ic/Ie as well as a high MR ratio. The reason why such effects can be obtained will be explained below.

Intensity of interface reflection of electrons at the magnetic/nonmagnetic interface varies depending on the band structures in the magnetic and nonmagnetic layers. The band structures in various magnetic and nonmagnetic materials have ever been investigated experimentally and theoretically. The band structure is generally represented in a wavenumber space, called the "Brillouin zone". For example, the electrons travel in a crystal of Fe or Au in the [100]-direction can be represented by dots on the $\Delta$ line of the Brillouin zone. The states of electrons can be distinguished depending on symmetric properties of wave functions, which are usually described with symbols such as $\Delta_1$ and $\Delta_2$ on the basis of irreducible representation of the group theory. The original point of the Brillouin zone is called a $\Gamma$ point, and the states of electrons at this point can be described with symbols such as $\Gamma_{12}$ and $\Gamma_{25}$ on the basis of the group theory.

Figure 1A:
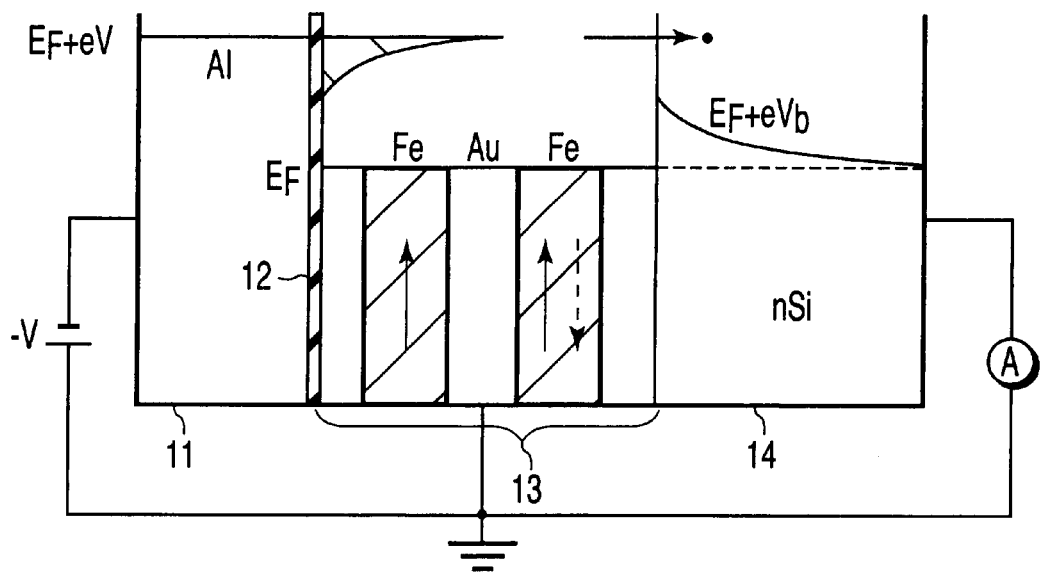
FIG. 1A is an energy band diagram of a conventional spin-valve transistor.
Figure 1B:
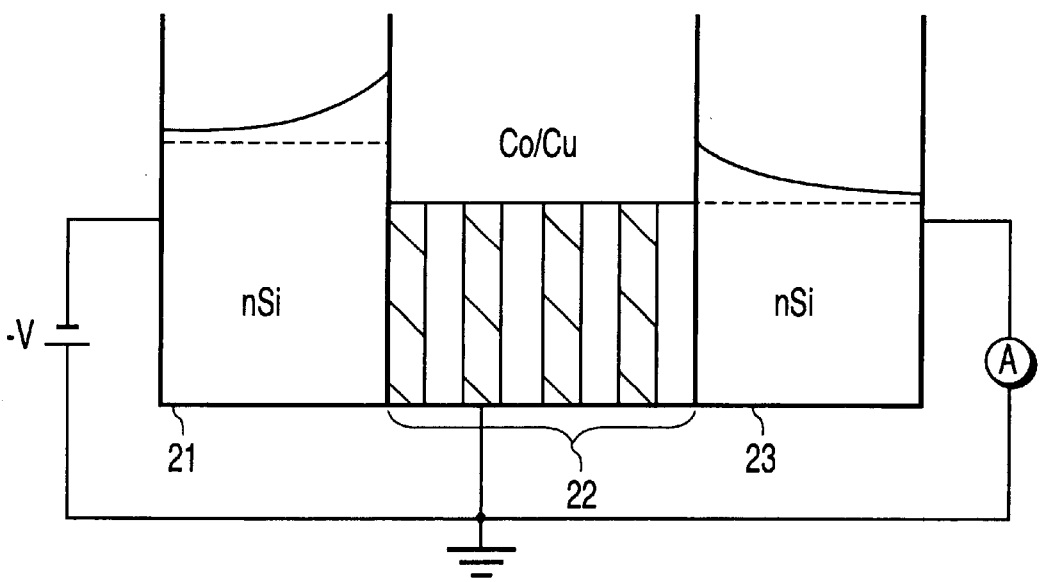
FIG. 1B is an energy band diagram of another conventional spin-valve transistor.
Figure 4:
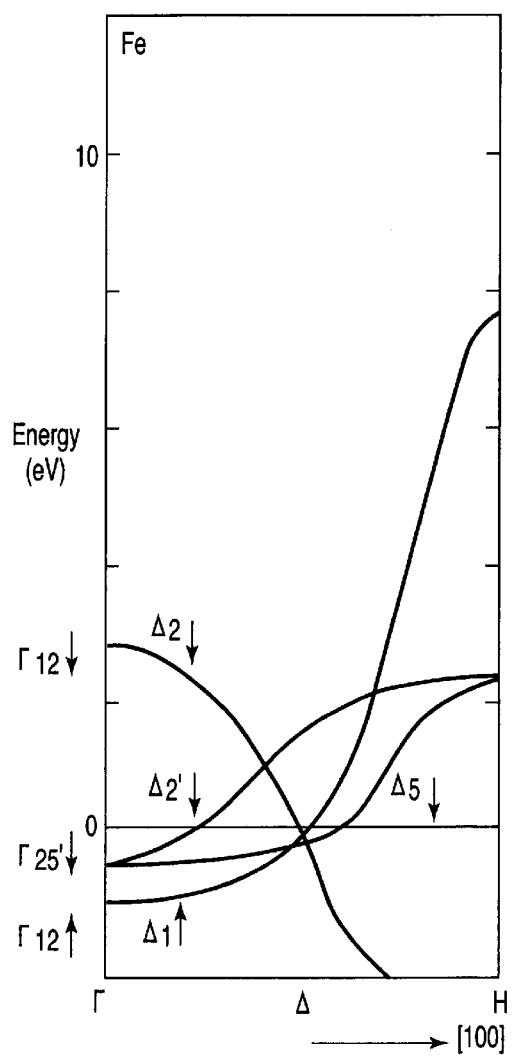
FIG. 4 is a graph illustrating the energy band of Fe in the [100]-direction.

Next, a specific example of combination of Fe(100)/Au (100) that can be epitaxially grown will be explained. The spin-valve film based on this combination can be represented as M/A/M'. FIG. 3 shows the band of Au in the [100]-direction. In FIG. 3, the ordinate represents energy of electrons, while the abscissa represents the wavenumber of electrons along the $\Delta$ line of the Brillouin zone. As shown in FIG. 3, the band of Au in the [100]-direction has $\Delta_1$ symmetry in the vicinity of the Fermi level. On the other hand, FIG. 4 shows the bands of Fe in the [100]-direction. As shown in FIG. 4, Fe has complicated bands, in which the up-spin bands have $\Delta_1$ symmetry in a region over the Fermi level and the down-spin bands have $\Delta_2$, $\Delta_2'$ and $\Delta_5$ symmetries.

Since electrons can travel between bands having the same symmetrical property without being reflected, the up-spin electrons having higher energy than the Fermi level and moving in the [100]-direction can pass through the Au/Fe interface. On the other hand, since electrons cannot travel between bands having a different symmetrical property, the down-spin electrons will be strongly reflected. Namely, as shown in FIG. 2B, the ballistic conduction and interface reflection of electrons with intense spin-dependency will be generated. Therefore, it becomes possible to obtain an element exhibiting a higher collector current as compared with the case where the diffusive scattering of electrons is generated with retaining a high MR ratio. Note that it is preferable to set the thickness of the magnetic layer to about 2 nm or less in order to suppress the diffusive scattering in the magnetic layer. The relationship between FIGS. 3 and 4 can be obtained similarly even when Ag, Pt, Cu or Al is employed as a nonmagnetic layer in place of Au.

Figure 5:
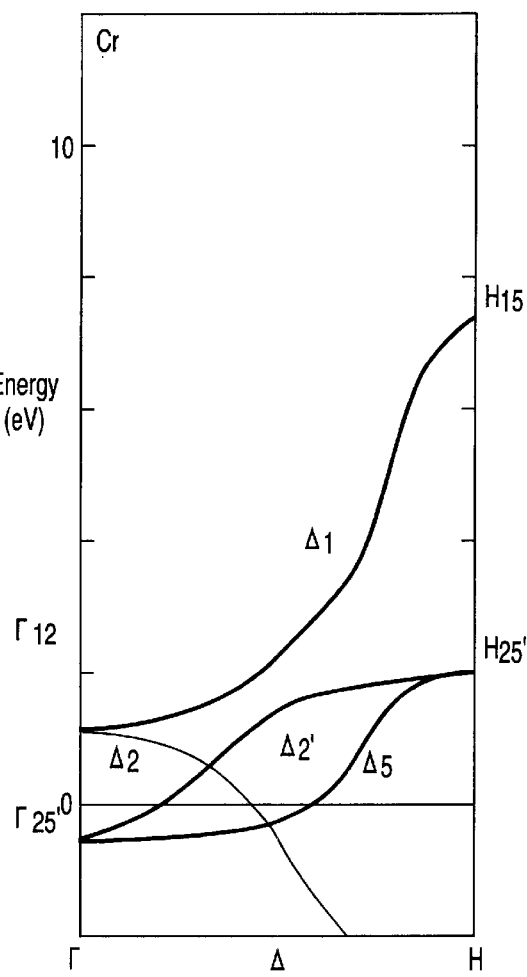
FIG. 5 is a graph illustrating the energy band of Cr in the [100]-direction.

Next, a combination of Fe(100)/Cr(100) that can be epitaxially grown will be explained. The spin-valve film based on this combination can be represented as M/B/M'. FIG. 5 shows the band of Cr in the [100]-direction. As shown in FIG. 5, the band structure of Cr has $\Delta_2$, $\Delta_2'$ or $\Delta_5$ symmetry in a region over the Fermi level, each of which is similar to the down-spin band of Fe. Therefore, the down-spin electrons can pass through the Au/Fe interface, but the up-spin electrons will be reflected. Therefore, the ballistic conduction and interface reflection of electrons with intense spin-dependency will also be generated in this case, although the relationship in transmissivity between the up-spin electrons and the down-spin electrons becomes opposite to the case of the Au/Fe interface. The relationship between FIGS. 4 and 5 can be obtained similarly even when Mn, which has a similar band structure to that of Cr, is employed as a nonmagnetic layer in place of Cr.

As explained above, it is important in the present invention that the magnetic layer and nonmagnetic layer forming the spin-valve film included in the base are (100)-oriented. However, it is difficult to grow a (100)-oriented metal film on a IV-group semiconductor such as Si and Ge. On the other hand, it is known that a (100)-oriented metal film can be grown easily on a III–V compound semiconductor such as GaAs and InAs. Therefore, it is preferable in the spin-valve transistor according to the present invention that at least one of the emitter and collector, i.e., the underlayer of the base, comprises a III–V semiconductor. Specific examples of the III–V semiconductor include GaAs, GaN, GaP, InAs, InSb, and so on. In order to grow the (100)-oriented metal film on the III–V semiconductor, it is preferable to perform surface treatment of a substrate and to set appropriately a temperature of the substrate and a deposition rate of the metal film.

When a III–V semiconductor is used for the emitter in the spin-valve transistor according to the present invention, it is preferable to form a collector made of a semiconductor thin film or a stacked film comprising a semiconductor and a metal, the semiconductor of the collector having a smaller forbidden band width than the semiconductor of the emitter, in order to obtain a further higher collector current.

Figure 6A:
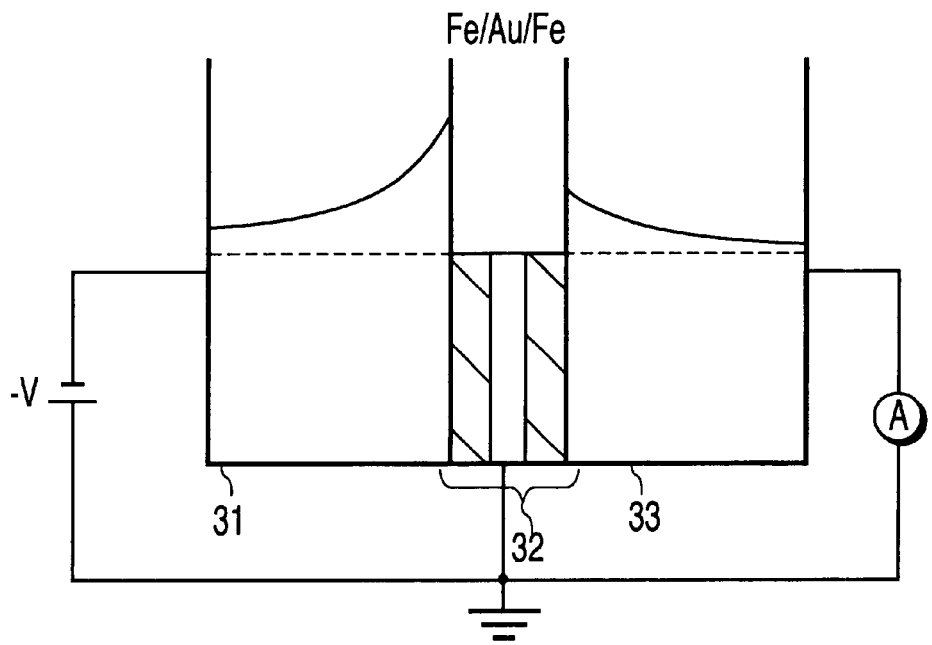
FIG. 6A is an energy band diagram of a spin-valve transistor according to an embodiment of the present invention.
Figure 6B:
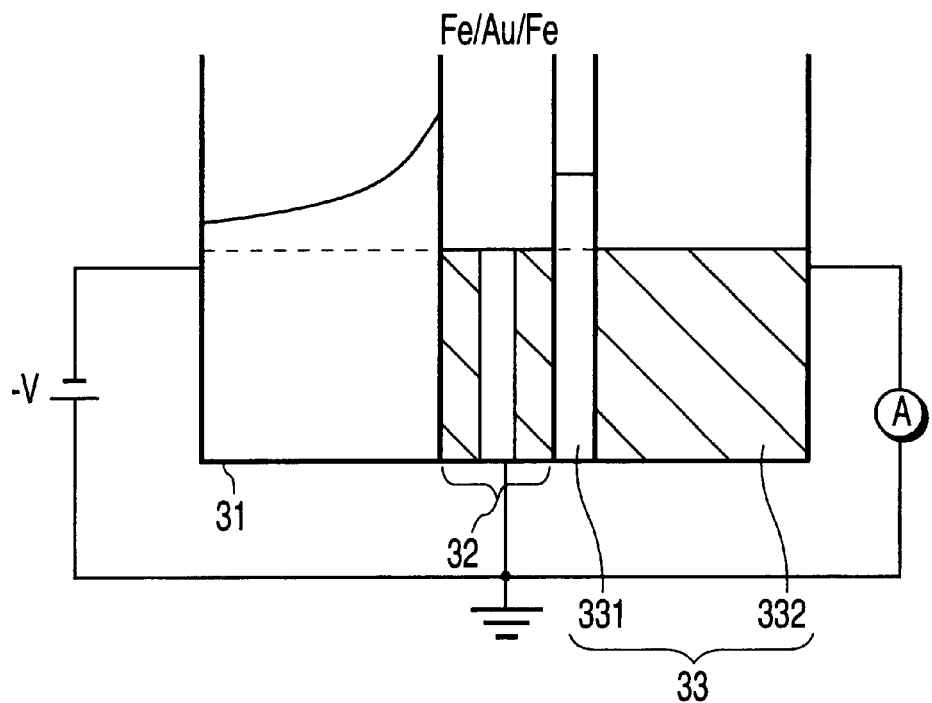
FIG. 6B is an energy band diagram of a spin-valve transistor according to another embodiment of the present invention.

FIGS. 6A and 6B show spin-valve transistors having a structure as described above. The spin-valve transistor shown in FIG. 6A has a structure in which stacked are an emitter 31 formed of a III–V semiconductor thin film, a base 32 comprising an Fe/Au/Fe spin-valve film, and a collector 33 formed of a semiconductor film, which has a smaller forbidden band width than the semiconductor of the emitter. On the other hand, the spin-valve transistor shown in FIG. 6B has a structure in which stacked are an emitter 31 formed of a III–V semiconductor thin film, a base 32 comprising an Fe/Au/Fe spin-valve film, and a collector 33 formed of a metal thin film 331 and a semiconductor film 332, which has a smaller forbidden band width than the semiconductor of the emitter.

EXAMPLES

Example 1

Figure 7:
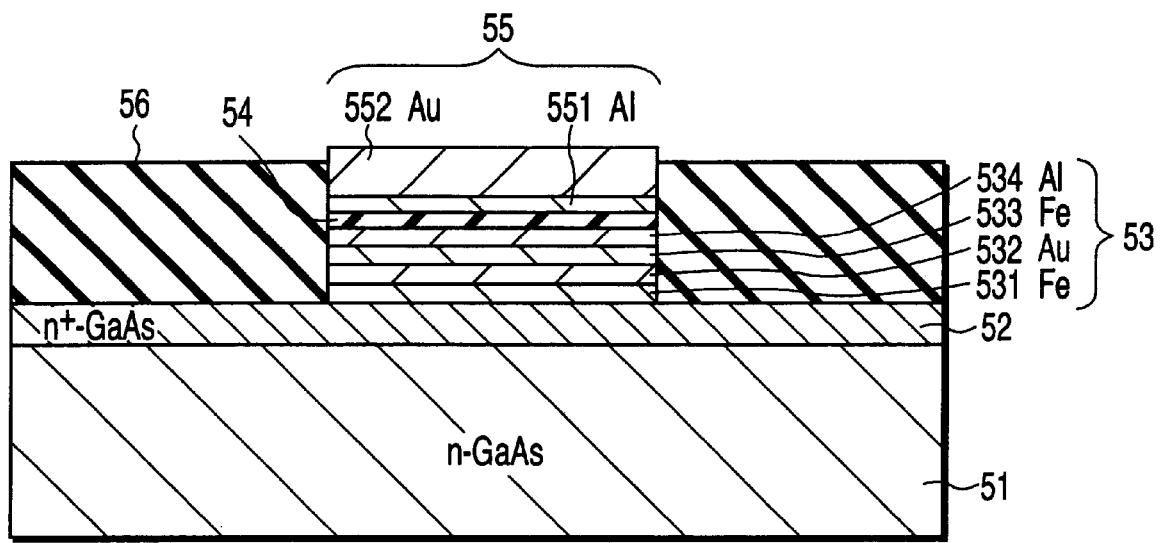
FIG. 7 is a cross-sectional view illustrating the spin-valve transistor in Example 1 of the present invention.

A spin-valve transistor comprising a (100) n-GaAs collector, a (100) Fe/Au/Fe/Al base, an $Al_2O_3$ tunnel barrier, and an Al emitter:

An example of fabricating process of the spin-valve transistor shown in FIG. 7 will be explained below. In order to grow a stacked film of Fe/Au/Fe/Al epitaxially on a (100) GaAs substrate, it is required to remove an oxide film formed on the surface. First, the (100) n-GaAs substrate 51 was placed in a multi-chamber MBE apparatus, followed by evacuating the chambers to about $2 \times 10^{-10}$ torr, and then, in the first chamber, the $n^+$-GaAs layer 52 was homo-epitaxially grown on the (100) n-GaAs substrate 51 to a thickness of about 1 μm to form a collector. The surface of the $n^+$-GaAs layer 52 was observed with STM (scanning tunnel microscope) and RHEED (high-speed electron beam diffraction). It was confirmed that the surface of the GaAs layer was made into a 2×4 structure terminated with AS dimers. The width of a terrace of the surface thereof was about 0.5 μm.

Incidentally, if the homo-epitaxial growth of the $n^+$-GaAs layer 52 is not performed, the GaAs substrate is subjected to etching treatment in a 10% ethanol solution of hydrochloric acid, and then the substrate is placed in a vacuum chamber, followed by heat-treating the substrate under a reduced pressure of not more than about $10^{-9}$ torr at a temperature ranging from 350 to 500° C. to remove an oxide film formed on the surface thereof.

Then, the substrate was transferred to the second chamber, and then, by making use of Knudsen cells, an Fe film 531 having a thickness of about 2 nm, an Au film 532 having a thickness of about 10 nm, an Fe film 533 having a thickness of about 1 nm, and an Al film 534 having a thickness of about 5 nm were successively deposited to form the base 53. In these processes, it was possible to obtain excellent (100)-oriented films when the deposition rate was set within the range of 0.01 to 0.1 nm/sec. Thereafter, the substrate was transferred to the third chamber provided with an Al source, and an $Al_2O_3$ layer having a thickness of about 1.5 nm was deposited on the base 53 under an atmosphere of about $10^{-5}$ torr oxygen partial pressure to form a tunnel insulator 54. The resultant substrate was transferred to the second chamber again, and an Al film 551 having a thickness of about 10 nm and an Au film 552 having a thickness of about 100 nm were successively deposited as thin films of the emitter 55 on the tunnel insulator 54. Then, the junction area of the element was defined to about 50 μm×50 μm by means of photolithography and Ar-ion milling. Finally, $CaF_2$ was deposited to form an interlayer insulator 56.

An MR ratio of the transistor was measured while applying a magnetic field in the in-plane direction. As a result, when a voltage of about 1.3V was applied between the base and the emitter, the MR ratio was found to be about 260%, and the ratio of Ic/Ie was found as high as about $7 \times 10^{-2}$.

Comparative Example 1

A spin-valve transistor comprising a (100) n-Si collector, a (111) Au/Fe/Au/Fe/Al base, an $Al_2O_3$ tunnel barrier, and an Al emitter:

Fabricated was a transistor having a similar structure to that of Example 1 except that a (100) Si substrate was used instead of the (100) GaAs substrate in Example 1. As a result, the base on the Si substrate was made into a (111)-oriented film, not a (100)-oriented film.

An MR ratio of the transistor was measured while applying a magnetic field in the in-plane direction. As a result, when a voltage of about 1.3V was applied between the base and the emitter, the MR ratio was found to be about 230%, but the ratio of Ic/Ie was found as low as about $4 \times 10^{-4}$.

Example 2

Fabricated was a transistor having a similar structure to that of Example 1 except that the junction area was set to about 1 μm×1 μm by making use of photolithography and Ar-ion milling.

An MR ratio of the transistor was measured while applying a magnetic field in the in-plane direction. As a result, when a voltage of about 1.3V was applied between the base and the emitter, the MR ratio was found to be about 250%, and the ratio of Ic/Ie was found as high as about $5\times10^{-2}$.

Example 3

Fabricated was a transistor having a similar structure to that of Example 1 except that a stacked film of Fe/Cr/Fe/Al was employed as a base in place of the stacked film of Fe/Au/Fe/Al in Example 1.

An MR ratio of the transistor was measured while applying a magnetic field in the in-plane direction. As a result, when a voltage of about 1.3V was applied between the base and the emitter, the MR ratio was found to be about 300%, and the ratio of Ic/Ie was found as high as about $2\times10^{-2}$.

Example 4

Fabricated was a transistor having a similar structure to that of Example 1 except that InAs was employed as a collector in place of GaAs in Example 1.

An MR ratio of the transistor was measured while applying a magnetic field in the in-plane direction. As a result, when a voltage of about 1.3V was applied between the base and the emitter, the MR ratio was found to be about 260%, and the ratio of Ic/Ie was found as high as about $2\times10^{-1}$.

Example 5

A spin-valve transistor comprising a (100) n-GaAs emitter, a (100) Fe/Au/Fe/Au base, and a Ge/Au collector:

A transistor having the titled structure was fabricated using similar procedures to those in Example 1. In this transistor, the emitter was formed of the substrate and a Schottky junction was formed between the emitter and the base. The collector was formed of a stacked structure of a Ge thin film having a thickness of about 10 nm and an Au thin film having a thickness of about 100 nm. The Ge of the collector has a smaller forbidden band width than the GaAs of the emitter.

An MR ratio of the transistor was measured while applying a magnetic field in the in-plane direction. As a result, when a voltage of about 0.8V was applied between the base and the emitter, the MR ratio was found to be about 260%, and the ratio of Ic/Ie was found as high as about $3\times10^{-1}$.

Example 6

Fabricated was a transistor having a similar structure to that of Example 5 except that a stacked film of (100) Co/Au/permalloy/Au was employed as a base in place of the stacked film of Fe/Au/Fe/Au in Example 5.

An MR ratio of the transistor was measured while applying a magnetic field in the in-plane direction. As a result, when a voltage of about 0.8V was applied between the base and the emitter, the MR ratio was found to be about 300%, and the ratio of Ic/Ie was found as high as about $1\times10^{-1}$.

As seen from the above explanation, the principle of the present invention can be applied to various materials, without being limited to the combinations of materials set forth in the above examples. Namely, the principle of the present invention can be generally applied to any combination of materials as long as the symmetry of the conduction band in the nonmagnetic layer differs from the symmetry of the up-spin band or of down-spin band in the magnetic layer at the interface of the oriented magnetic layer/nonmagnetic layer. The up-spin electrons are subjected to intense interface reflection in the former combination of materials, while the down-spin electrons are subjected to intense interface reflection in the latter combination of materials. Consequently, in any of these combinations of materials, it is possible to provide a spin-valve transistor exhibiting not only a high MR ratio but also a high ratio of Ic/Ie.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin-valve transistor, comprising:

an emitter;

a base comprising a spin-valve film in which two magnetic layers are stacked with interposing a nonmagnetic layer between the two magnetic layers; and a collector;

the spin-valve film having a stacked structure of M/A/M' or M/B/M' and the spin-valve film being (100)-oriented, where each of M and M' comprises at least one element selected from the group consisting of Fe, Co, Ni and an alloy including Fe, Co, Ni; A comprises at least one element selected from the group consisting of Au, Ag, Pt, Cu and Al; and B comprises at least one element selected from the group consisting of Cr and Mn.

2. The spin-valve transistor according to claim 1, wherein at least one of the emitter and the collector comprises a III–V semiconductor.

3. The spin-valve transistor according to claim 2, wherein the III–V semiconductor is selected from the group consisting of GaAs, GaN, GaP, InAs and InSb.

4. The spin-valve transistor according to claim 1, wherein the emitter comprises a semiconductor thin film, the collector comprises a semiconductor thin film or a stacked film comprising a semiconductor and a metal, the semiconductor in the collector having smaller forbidden band width than the semiconductor in the emitter.

5. The spin-valve transistor according to claim 1, wherein a thickness of the magnetic layer is sufficiently smaller as compared with an electron mean free path in the magnetic layer.

6. The spin-valve transistor according to claim 5, wherein a thickness of the magnetic layer is about 2 nm or less.

7. The spin-valve transistor according to claim 1, wherein a tunnel junction is formed between the emitter and the base.

8. The spin-valve transistor according to claim 1, wherein a Schottky junction is formed between the emitter and the base.

* * * * *